(12) United States Patent
Tanaka

(10) Patent No.: US 6,919,265 B2
(45) Date of Patent: Jul. 19, 2005

(54) SEMICONDUCTOR DEVICE WITH ELONGATED INTERCONNECTING MEMBER AND FABRICATION METHOD THEREOF

(75) Inventor: Hiroyuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/460,235

(22) Filed: Jun. 13, 2003

(65) Prior Publication Data

US 2003/0219967 A1 Nov. 27, 2003

Related U.S. Application Data

(63) Continuation of application No. 10/166,182, filed on Jun. 11, 2002, now Pat. No. 6,600,225.

(30) Foreign Application Priority Data

Jun. 12, 2001 (JP) ........................................ 2001-177111

(51) Int. Cl.[7] .............................................. H01L 21/44
(52) U.S. Cl. ........................ 438/622; 438/637; 438/672
(58) Field of Search ................................ 438/597, 598, 438/618, 622, 631, 637–640, 669–672, 611, 652, 666; 174/262–265, 260; 257/750, 758, 775, 778, 773

(56) References Cited

U.S. PATENT DOCUMENTS

| 5,248,854 | A | * | 9/1993 | Kudoh et al. ................ 174/261 |
| 5,471,090 | A | * | 11/1995 | Deutsch et al. ............. 257/734 |
| 5,534,666 | A | * | 7/1996 | Ishida ......................... 174/260 |
| 5,744,758 | A | * | 4/1998 | Takenouchi et al. ......... 174/255 |
| 5,854,131 | A | * | 12/1998 | Dawson et al. ............. 438/666 |
| 5,872,338 | A | * | 2/1999 | Lan et al. .................... 174/255 |
| 6,147,404 | A |  | 11/2000 | Pramanick et al. |
| 6,239,025 | B1 | * | 5/2001 | Bease et al. ................ 438/637 |
| 6,331,679 | B1 | * | 12/2001 | Higashi ....................... 174/260 |
| 6,338,631 | B1 |  | 1/2002 | Hashimoto et al. |
| 6,353,261 | B1 |  | 3/2002 | Weling |
| 6,429,384 | B1 | * | 8/2002 | Downes et al. ............. 174/260 |
| 6,446,873 | B1 | * | 9/2002 | Geryk ......................... 235/487 |
| 6,448,631 | B2 | * | 9/2002 | Gandhi et al. .............. 257/635 |
| 6,448,651 | B1 |  | 9/2002 | Kim |
| 6,762,489 | B2 | * | 7/2004 | Daves et al. ................ 257/692 |

FOREIGN PATENT DOCUMENTS

| JP | 60-140720 | 7/1985 |
| JP | 61-140149 | 6/1986 |
| JP | 63-228736 | 9/1988 |
| JP | 04-029357 | 1/1992 |
| JP | 04-152526 | 5/1992 |
| JP | 04-348547 | 12/1992 |
| JP | 05-259293 | 10/1993 |
| JP | 06-204345 | 7/1994 |

(Continued)

OTHER PUBLICATIONS

Webster's II New Riverside University Dictionary, p. 1262, © 1984.*

Primary Examiner—Evan Pert
(74) Attorney, Agent, or Firm—Rabin & Berdo, PC

(57) ABSTRACT

In a semiconductor device with multiple wiring layers, to connect a conductive line in a lower wiring layer to a conductive line in an upper wiring layer, two conductive members are formed in the space between the upper and lower conductive layers, one conductive member in contact with each conductive line. The two conductive members meet in the space between the two conductive layers to form an electrical path between the two conductive lines. One or both of the conductive members may have a rectangular bar shape extending lengthwise along the conductive line with which it makes contact. The conductive members can have a reduced height and enlarged area that enables interconnections to be formed with greater stability and reliability than by conventional methods.

20 Claims, 14 Drawing Sheets

FOREIGN PATENT DOCUMENTS

| | | |
|---|---|---|
| JP | 06-275577 | 9/1994 |
| JP | 07-235598 | 9/1995 |
| JP | 09-017864 | 1/1997 |
| JP | 10-242270 | 9/1998 |
| JP | 11-074345 | 3/1999 |
| JP | 11-317407 | 11/1999 |

* cited by examiner

SEMICONDUCTOR DEVICE WITH ELONGATED INTERCONNECTING MEMBER AND FABRICATION METHOD THEREOF

CROSS REFERENCE TO RELATED APPLICATION

This is a continuation of application Ser. No. 10/166,182, filed Jun. 11, 2002 now U.S. Pat. No. 6,600,225.

BACKGROUND OF THE INVENTION

1. Field of the Invention

The present invention relates to a semiconductor device having multilayer wiring, and more particularly to a method of forming interconnections between an upper wiring layer and a lower wiring layer.

2. Description of the Related Art

FIG. 14 shows a partial sectional view of a conventional semiconductor device having a lower conductive layer or wiring layer including a first conductive line or wire 61, an inter-layer dielectric film 62 with a through hole 63, and an upper conductive layer or wiring layer including a second conductive line or wire 64 that is connected to the lower-layer wire 61 by a metal plug filling the through hole 63. The through hole 63 has a depth d, radius r, and diameter 2r.

The multilayer wiring structure shown in FIG. 14 is fabricated as follows. First, a layer of metal is deposited on the entire surface of the device and patterned by photolithography and etching to form a lower-layer pattern of conductive lines 61. Next, the inter-layer dielectric film 62 is deposited on the entire surface and planarized by chemical-mechanical polishing (CMP). The inter-layer dielectric film 62 comprises a dielectric material such as silicate glass. The inter-layer dielectric film 62 is then etched to create through holes 63 at positions where the lower-layer conductive lines 61 will be connected to upper-layer conductive lines 64, and the through holes 62 are filled with metal. Another layer of metal is then deposited on the entire surface and patterned by photolithography and etching to create the upper-layer conductive lines 64.

As semiconductor device geometries have shrunk, so has the diameter (2r) of the through holes, and their aspect ratio ($d/\pi r^2$) has increased. As a result, it has become difficult to assure the stable formation of a resist pattern for the small-diameter through holes in the photolithographic process, and to assure that the through holes will be etched to a constant depth during the etching process. The result is unreliable connections between the different wiring layers of a semiconductor device with multilayer wiring. The problem of the formation of a reliable connection structure for multilayer wiring has hindered progress toward devices with still smaller geometries.

A further problem is that if the depth d of the through holes is reduced as their diameter is reduced, the reduced spacing between wiring layers increases the parasitic capacitance of the wiring. The limiting dimensions for the stable formation of interconnections between different wiring layers in conventional semiconductor devices have been, for example, a through-hole diameter of one-fifth of a micrometer ($2r=0.2$ $\mu$m) and a through-hole depth of one-half of a micrometer ($d=0.5$ $\mu$m).

SUMMARY OF THE INVENTION

An object of the present invention is accordingly to provide a semiconductor device with a multilayer wiring interconnection structure that permits smaller device geometries.

Another object of the invention is to provide a fabrication method for such a semiconductor device.

The invented semiconductor device includes a first conductive layer and a second conductive layer. To connect a conductive line or pattern in the first conductive layer to a conductive line or pattern in the second conductive layer, a pair of conductive members or conductors are formed between the two conductive layers, both conductive members having heights less than the separation between the conductive layers. One conductive member makes contact with or is unitary with the conductive line or pattern in the lower conductive layer; the other conductive member makes contact with or is unitary with the conductive line or pattern in the upper conductive layer. The two conductive members extend for different distances in at least one direction parallel to the conductive layers. The two conductive members make mutual contact, thereby establishing an electrical path between the two conductive lines. One conductive member may be slotted to receive the other conductive member.

In one fabrication method for the invented semiconductor device, after a lower conductive layer is formed and patterned, a first dielectric film is deposited, covering the lower conductive layer. The first dielectric film is patterned to form a first hole extending to a conductive line or pattern in the lower conductive layer, and the first hole is filled with a conductive material to form a first conductive member or conductor. A second dielectric film is then deposited on the first dielectric film, and patterned to form a second hole extending to the first conductive member. The second hole is filled with a conductive material to form a second conductive member or conductor making contact with the first conductive member or conductor, and an upper conductive layer is formed on the second dielectric film. The upper conductive layer includes a conductive line or pattern making contact with the second conductive member.

In this method, the second conductive member and the upper conductive layer may be formed in a single step, by depositing a layer of conductive material that covers the second dielectric film and fills the second hole, then patterning this layer of conductive material to form the upper conductive layer. The second conductive member, disposed in the second hole, is unitary with a conductive line or pattern in the upper conductive layer.

Alternatively, the upper conductive layer may be formed by depositing a third dielectric film, patterning the third dielectric film to form trenches, and filling the trenches with a conductive material. The conductive material may be copper.

Similarly, the lower conductive layer may be formed by depositing a dielectric film, patterning the dielectric film to form trenches, and filling the trenches with a conductive material such as copper.

In another fabrication method for the invented semiconductor device, the lower conductive layer is formed in a two-step process that also forms the first conductive member or conductor. Specifically, a conductive film is patterned to form a conductive pattern. A coating of photoresist is applied, covering the conductive pattern, and the coating is patterned by photolithography to leave a mask that masks part of the conductive pattern. The exposed part of the conductive pattern is then etched to reduce its height. The part of the conductive pattern that is not etched because it is below the level at which etching is stopped becomes the lower conductive layer. A masked part of the conductive pattern remaining above this level becomes the first conductive member, which is unitary with the lower conductive layer. The second conductive member and the upper conductive layer are then formed substantially as described above, by depositing a dielectric film, forming a hole in the dielectric film extending to the first conductive member, filling the hole with a conductive material, and forming a conductive layer on the dielectric film.

Either fabrication method may by adapted to form a slot in the first conductive member to receive the second conductive member. For example, after the hole for the second conductive member has been formed, the first conductive member may be etched to create such a slot.

Needless to say, either fabrication method may be adapted to form a plurality of first conductive members and a plurality of second conductive members.

The invention enables the wiring dimensions of a semiconductor device to be reduced by reducing the widths of the conductive members without requiring an equal reduction of the lengths of the conductive members. Specifically, a conductive member having an elongated shape such as a rectangular bar shape can be made narrow enough to permit very fine, closely-spaced conductive lines, while still being long enough to ensure that the conductive member is reliably formed. Furthermore, if an electrical path between two conductive layers is created by a conductor having the form of an elongated bar meeting a conductor having the form of a plug, the hole for the plug-shaped conductor can be shallow enough to ensure reliable formation of the plug-shaped conductor, while the additional height of the bar-shaped conductor permits sufficient separation between the two conductive layers to avoid problems caused by parasitic capacitance.

DETAILED DESCRIPTION OF THE INVENTION

Figure 1A:
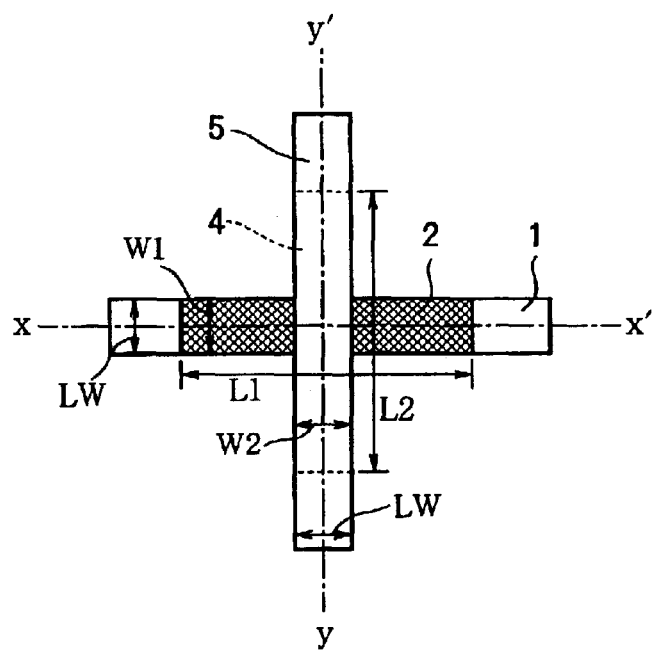
FIG. 1A is a partial plan view of a semiconductor device illustrating a first embodiment of the invention.

Embodiments of the invention will now be described with reference to the attached drawings, in which like elements are indicated by like reference characters.

In the following description and the appended claims, the terms conductive line, conductive pattern, and wire will be used with substantially the same meaning; dielectric films will also be referred to as insulating films; and the terms conductive member and conductor will be treated as synonyms.

First Embodiment

The structure of a semiconductor device according to the first embodiment is illustrated in FIGS. 1A to 4C. As shown in these drawings, the semiconductor device includes a first conductive line or first conductive pattern 1 in a lower conductive layer, a first conductive member or first conductor in the form of a rectangular metal bar 2, an inter-layer dielectric film 3 having an inter-layer thickness d, a second conductive member or second conductor in the form of a rectangular metal bar 4, and a second conductive line or second conductive pattern 5 in an upper conductive layer. Both conductive lines (or patterns) 1, 5 have a line width LW, rectangular metal bar 2 has height H1, and rectangular metal bar 4 has height H2. The separation d between the upper conductive layer and the lower conductive layer (that is, the inter-layer thickness) is the sum of heights H1 and H2.

Figure 1B:
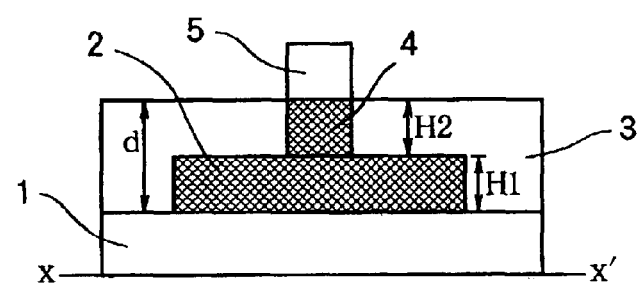
FIG. 1B is a sectional view along line x–x' in FIG. 1A.
Figure 1C:
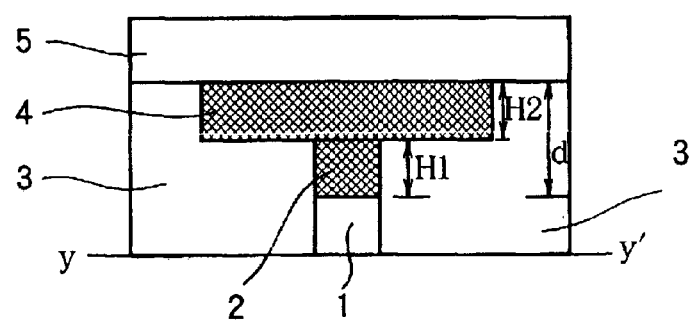
FIG. 1C is a sectional view along line y–y' in FIG. 1A.

In each drawing, rectangular metal bar 2 is aligned above and in contact with lower-layer conductive line 1, while rectangular metal bar 4 is aligned below and in contact with upper-layer conductive line 5. In FIG. 1A, the conductive lines 1, 5 are both straight, and cross at substantially a right angle; rectangular metal bar 2 is a straight bar with length L1 and width W1, while rectangular metal bar 4 is a straight bar with length L2 and width W2. Both bars are centered at the point at which conductive line 1 crosses conductive line 5. As shown in FIGS. 1B and 1C, the rectangular metal bars 2, 4 are in mutual contact at this point. In FIGS. 2A to 4C, lower-layer conductive line 1 bends at substantially a right angle and is connected to upper-layer conductive line 5 at or near the bend. In FIGS. 2A to 3C, rectangular metal bar 2 has a modified rectangular shape that follows the bend.

In the semiconductor device according to the first embodiment, rectangular metal bar 2 is aligned above the lower-layer conductive line 1, and extends for part of the length of the lower-layer conductive line 1, while rectangular metal bar 4 is aligned below the upper-layer conductive line 5, and extends for part of the length of the upper-layer conductive line 5. Rectangular metal bar 2 is formed in contact with or is unitary with the lower-layer conductive line 1; rectangular metal bar 4 is formed in contact with or is unitary with the upper-layer conductive line 5. Rectangular metal bar 2 makes contact with rectangular metal bar 4, establishing an electrical path between the lower-layer conductive line 1 and the upper-layer conductive line 5.

In the first embodiment, the sum of the height H1 of rectangular metal bar 2 and the height H2 of rectangular metal bar 4 is equal to the separation d between the lower-layer conductive line 1 and the upper-layer conductive line 5 (d=H1+H2), so neither rectangular metal bar is as high as the separation d (d>H1 and d>H2). The width W1 of rectangular metal bar 2 is equal to the line width LW of conductive line 1, and the width W2 of rectangular metal bar 4 is equal to the line width LW of conductive line 5 (W1=W2=LW). The length L1 of rectangular metal bar 2 is set to a value exceeding the width W1 of the lower-layer conductive line 1, while the length L2 of rectangular metal bar 4 is set to a value exceeding the width W2 of the upper-layer conductive line 5 (L1>W1=LW, and L2>W2=LW).

Figure 14:
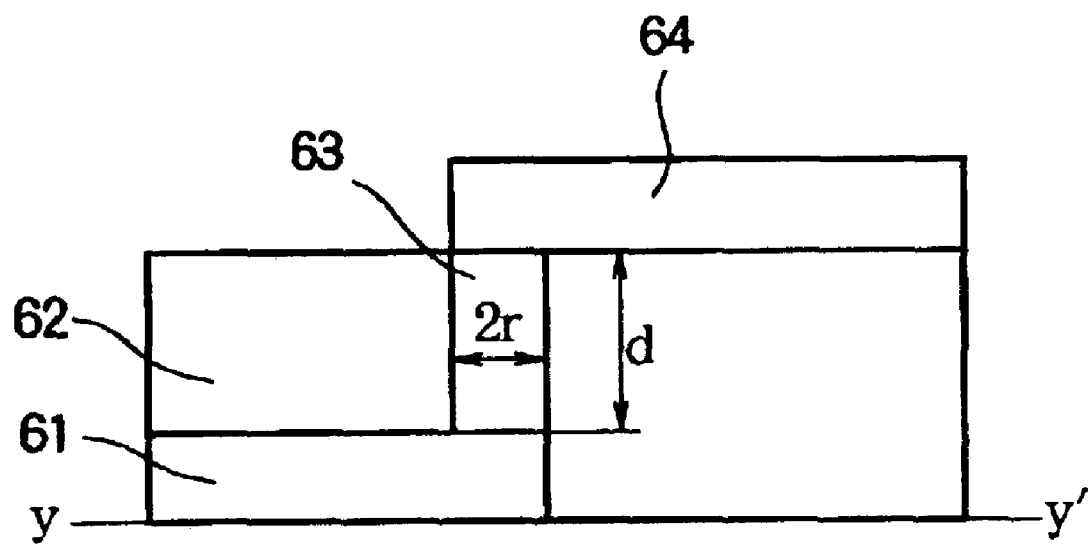
FIG. 14 is a sectional view showing the structure of a conventional semiconductor device.

A semiconductor device according to the first embodiment is designed on the basis of given multilayer wiring pattern rules. As an example of such rules, if the line width LW is 0.2 $\mu$m and the separation d between the lower-layer conductive line 1 and the upper-layer conductive line 5 is 0.5 $\mu$m, then the height H1 of rectangular metal bar 2 and the height H2 of rectangular metal bar 4 are both 0.25 $\mu$m, the width W1 of rectangular metal bar 2 and the width W2 of rectangular metal bar 4 are both 0.2 $\mu$m, and the length L1 of rectangular metal bar 2 and the length L2 of rectangular metal bar 4 are both 0.4 $\mu$m. The lengths L1 and L2 are unconstrained, provided that L1 and L2 are both equal to or greater than the line width LW. For comparison, if the conventional semiconductor device in FIG. 14 is designed on the basis of the same rules, the diameter 2r of the through hole 63 is 0.2 $\mu$m, which is the same as the wiring line width, and the depth of the through hole 63 is 0.5 $\mu$m, being equal to the separation d between the lower-layer conductive line 1 and the upper-layer conductive line 5.

Thus if a semiconductor device according to the first embodiment is designed according to the same pattern rules as a conventional semiconductor device, the heights H1 and H2 of the rectangular metal bars 2, 4 are both less than the conventional through-hole depth, their widths W1 and W2 are both the same as the conventional through-hole diameter 2r, and their lengths L1 and L2 exceed the conventional through-hole diameter 2r. The lengths of the rectangular metal bars 2, 4 also exceed the conventional through-hole diameter 2r in the wiring patterns with right-angle bends illustrated in FIGS. 2A to 4C. Furthermore, the pattern area (W1×L1) of rectangular metal bar 2 and the pattern area (W2×L2) of rectangular metal bar 4 exceed the pattern area ($\pi r^2$) of the conventional through hole. The aspect ratio (H1/(W1×L1)) of rectangular metal bar 2 and the aspect ratio (H2/(W2×L2)) of rectangular metal bar 4 are thus less than the aspect ratio (d/·r$^2$) of the conventional through hole, and the area (W1×W2=LW$^2$) of contact between the rectangular metal bars 2, 4 exceeds the area of contact of the conventional through hole with the upper and lower conductive layers.

The pattern areas of the rectangular metal bars 2, 4 can thus be increased while their aspect ratios are decreased, as compared with a conventional through hole. Consequently, the process of forming rectangular holes that will be filled with metal to create the rectangular metal bars 2, 4 is more stable than the process of forming conventional through holes. Alternatively, the lower rectangular metal bar 2 can be formed by photolithography and etching of the lower metal conductive layer, and this process is also more stable than the formation of conventional through holes. Interconnections between different conductive layers can therefore be formed with greater stability than in a conventional semiconductor device, and the reliability of the interconnections can be improved.

Furthermore, since the lengths L1, L2 of the rectangular metal bars 2, 4 exceed the conventional through-hole diameter 2r, in a photolithographic process for forming rectangular metal bar 4 or its rectangular hole, the alignment tolerance with respect to rectangular metal bar 2 can be greater than the alignment tolerance with respect to the lower conductive layer in the photolithographic process for forming conventional through holes. A larger alignment tolerance can also be allowed in the photolithographic process for forming the upper conductive layer than can be allowed when conventional through holes are employed. For this reason as well, different conductive layers can be interconnected by a more stable process than in a conventional semiconductor device, and the reliability of the interconnections can be improved.

Since the area of contact between the rectangular metal bars 2, 4 is also increased, as compared with the contact areas in a conventional semiconductor device, current is distributed over a larger area, and the current density at the interface between the rectangular metal bars 2, 4 is lower than the current density at the interfaces of a conventional through hole. This further improves the reliability of the interconnections.

Figure 2A:
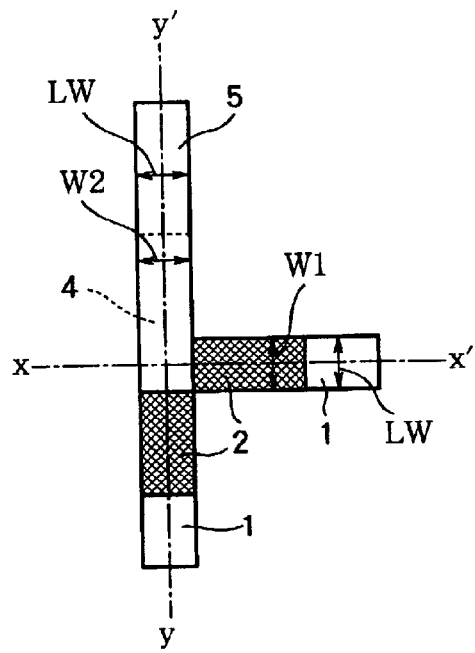
FIG. 2A is another partial plan view of a semiconductor device illustrating the first embodiment.
Figure 2B:
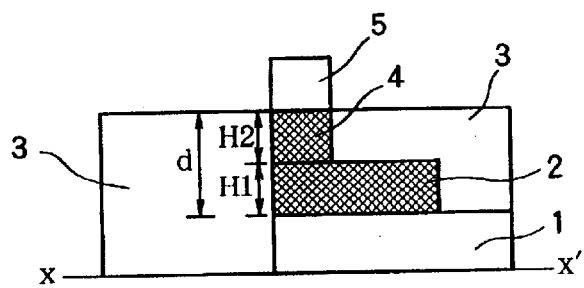
FIG. 2B is a sectional view along line x–x' in FIG. 2A.
Figure 2C:
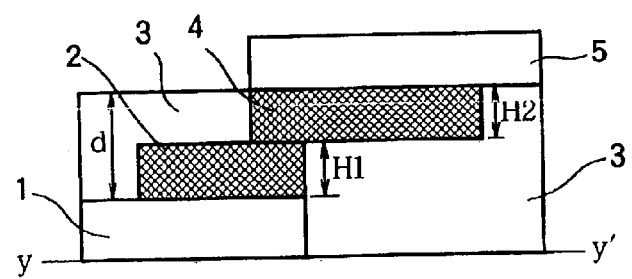
FIG. 2C is a sectional view along line y–y' in FIG. 2A.
Figure 3A:
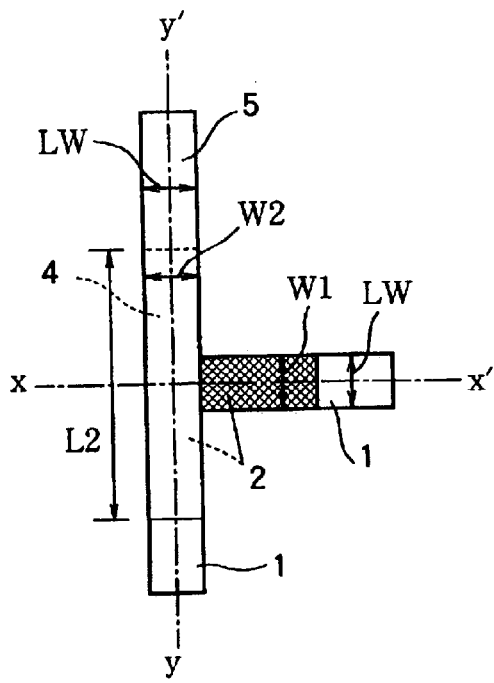
FIG. 3A is another partial plan view of a semiconductor device illustrating the first embodiment.
Figure 3B:
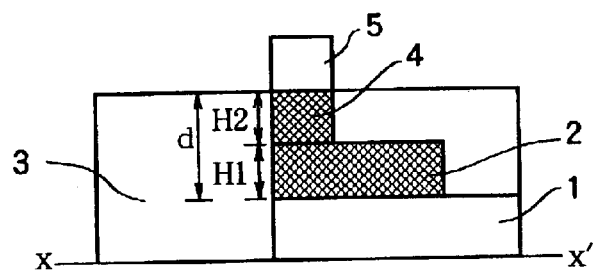
FIG. 3B is a sectional view along line x–x' in FIG. 3A.
Figure 3C:
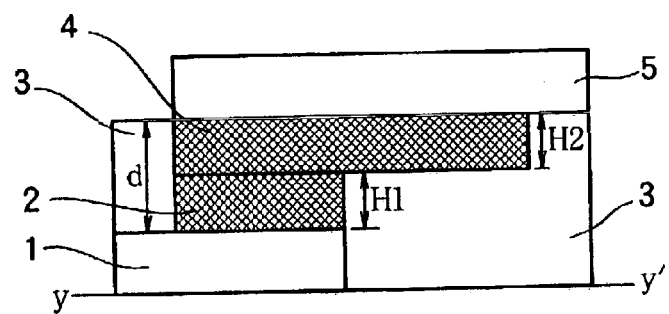
FIG. 3C is a sectional view along line y–y' in FIG. 3A.
Figure 4A:
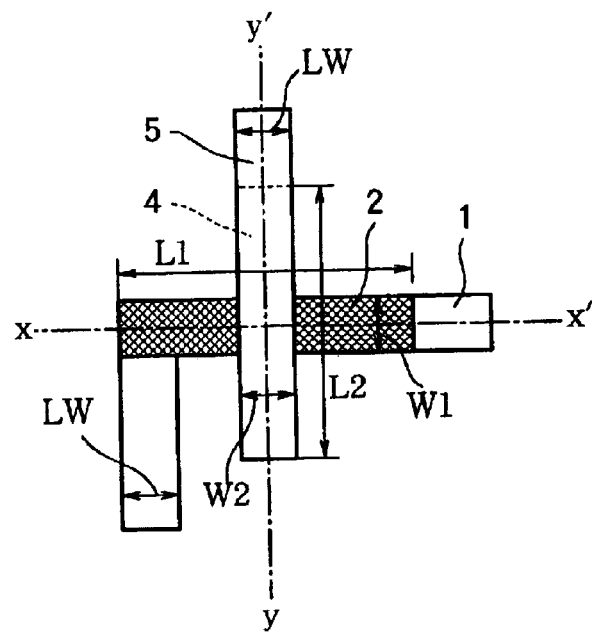
FIG. 4A is another partial plan view of a semiconductor device illustrating the first embodiment.
Figure 4B:
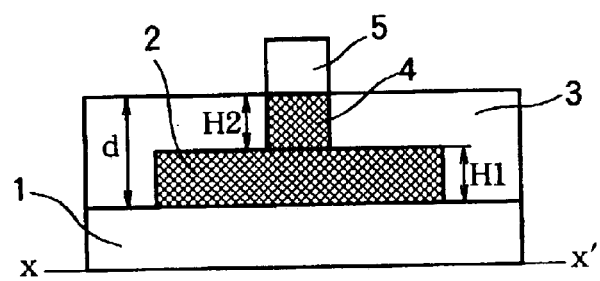
FIG. 4B is a sectional view along line x–x' in FIG. 4A.
Figure 4C:
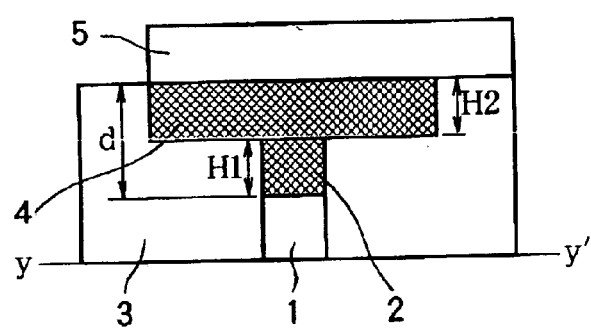
FIG. 4C is a sectional view along line y–y' in FIG. 4A.

The interconnecting structure in FIGS. 2A to 2C, in which the upper-layer conductive line 5 and rectangular metal bar 4 terminate above the bend in the lower-layer conductive line 1, provides an increased alignment tolerance for rectangular metal bar 4 in the x' and y directions, but not in the x and y' directions. This leads to consideration of the interconnecting structures illustrated in FIGS. 3A to 4C. In FIGS. 3A to 3C, the ends of the upper-layer conductive line 5 and rectangular metal bar 4 are extended in the y direction, increasing the alignment tolerance in the y direction, and also increasing the contact area between the rectangular metal bars 2, 4. In FIGS. 4A to 4C, the ends of the upper-layer conductive line 5 and rectangular metal bar 4 are extended in the y direction, and the upper-layer conductive line 5 and rectangular metal bar 4 are shifted in the x' direction, increasing the alignment tolerance in the x and y' directions.

In the semiconductor device of the first embodiment, since the lower-layer conductive line 1 and upper-layer conductive line 5 are interconnected through a pair of elongated metal bars 2, 4 with reduced heights and lowered aspect ratios, for given design rules, a more stable interconnection is formed than in the conventional structure. Moreover, the interconnection formation process remains stable even when the design rules are scaled down and the widths of the conductive lines and the rectangular metal bars are reduced. Interconnection reliability can therefore be improved, and semiconductor devices with smaller geometries can be fabricated.

Since the lengths L1, L2 of the rectangular metal bars 2, 4 are unconstrained, they can be optimized according to such factors as parasitic capacitance between the upper and lower conductive layers, photolithographic alignment tolerances, and multilayer wiring design rules.

When a plurality of upper-layer and lower-layer conductive lines 1, 5 are laid out, in principle, the lengths L1, L2 of the rectangular metal bars 2, 4 are not constrained by the conductive line spacing in the upper and lower layers. However, in the special case in which one interconnection between the upper and lower conductive layers is disposed near another interconnection between different conductive lines in the upper and lower conductive layers, it may be necessary to restrict the lengths L1 and L2 to avoid unwanted contact between the two interconnections, as will be described below.

Although increasing the lengths L1, L2 of the rectangular metal bars 2, 4 increases the photolithographic alignment tolerances, as the lengths L1, L2 increase, the rectangular metal bars 2, 4 may approach closer to conductive lines to which they are not connected in the upper and lower layers, so the parasitic capacitance between the rectangular metal bars and the upper and lower conductive layers increases. For this reason, the lengths L1, L2 of the rectangular metal bars 2, 4 should be selected to obtain an optimum balance between more lenient photolithographic alignment tolerances and increased parasitic capacitance between the upper and lower conductive layers.

Figure 5:
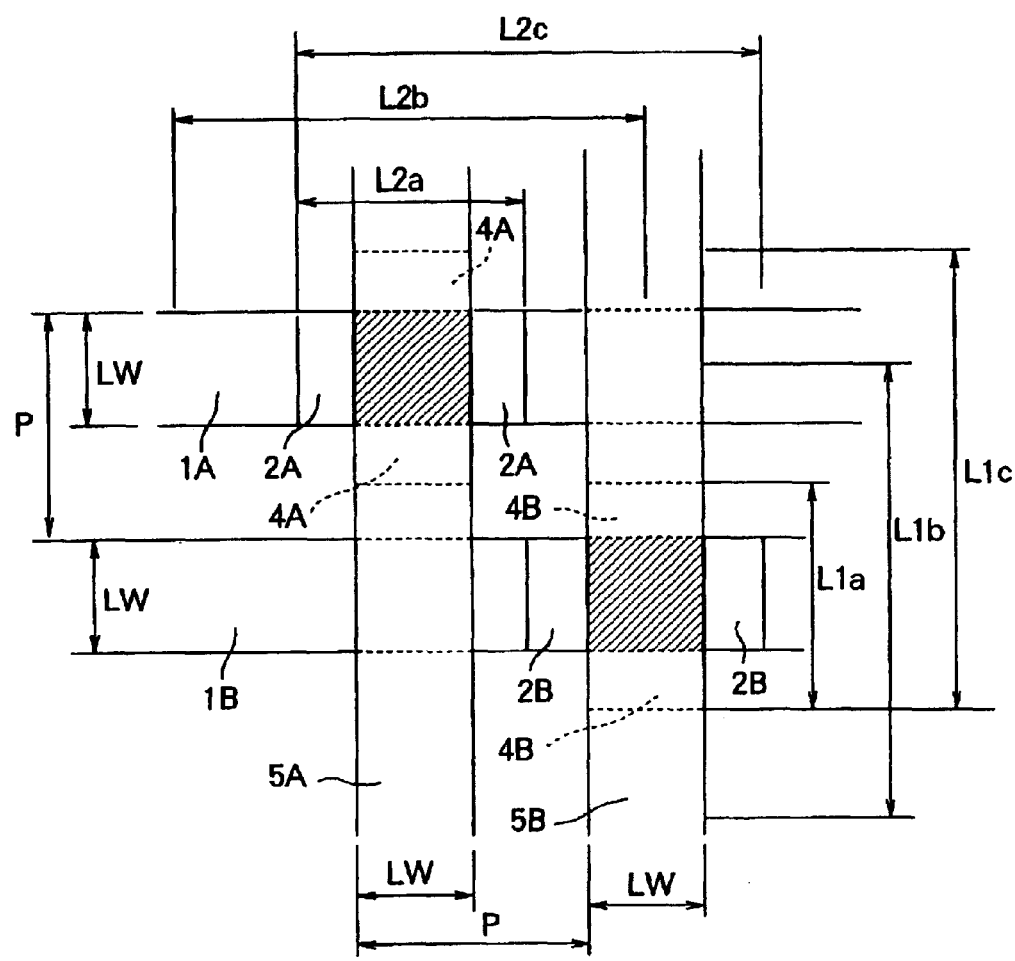
FIG. 5 is a partial plan view of a semiconductor device illustrating the first embodiment, indicating different possible lengths of the rectangular metal bars.

The lengths of the rectangular metal bars are further explained in FIG. 5. Reference characters 1A and 1B denote a pair of mutually adjacent conductive lines in the lower conductive layer; 5A and 5B denote a pair of mutually adjacent conductive lines in the upper conductive layer; 2A and 2B denote first rectangular metal bars formed on conductive lines 1A and 1B, respectively; 4A and 4B denote second rectangular metal bars formed below conductive lines 5A and 5B, respectively; L1a, L1b, and L1c denote three possible lengths of rectangular metal bar 4B; L2a, L2b, and L2c denote three possible lengths of rectangular metal bar 2A; LW denotes the width of conductive lines 1A, 1B, 5A, and 5B; and P denotes the pitch or spacing of conductive lines 1A and 1B, and of conductive lines 5A and 5B. The width LW of the conductive lines in both the upper and lower conductive layers is 0.2 μm, while the upper and lower conductive line pitch P is 0.4 μm. The lengths L2a and L1a of rectangular metal bars 2A and 4B are both greater than 0.5P (=LW) and both less than 1.5P. For the same rectangular metal bars 2A, 4B, lengths L2b and L1b are both greater than 1.5P, and lengths L2c and L1c are both strictly between 1.5P and 2.5P. Lower-layer conductive line 1A and upper-layer conductive line 5A are interconnected where they cross, by contact between rectangular metal bars 2A and 4A; similarly, lower-layer conductive line 1B and upper-layer conductive line 5B are interconnected where they cross, by contact between rectangular metal bars 2B and 4B.

In FIG. 5, if the length of rectangular metal bar 2A is set to L2b, extending to a position below upper-layer conductive line 5B, and if the length of rectangular metal bar 4B is set to L1b, extending to a position above lower-layer conductive line 1A, then rectangular metal bar 2A will meet rectangular metal bar 4B at the crossover between lower-layer conductive line 1A and upper-layer conductive line 5B. This unwanted contact can be avoided by restricting rectangular metal bar 2A to length L2a, so that it does not extend below upper-layer conductive line 5B, and restricting rectangular metal bar 4B to length L1a, so that it does not extend above lower-layer conductive line 1A. Lengths L2a and L1a may both be set equal to 0.4 μm (=P), for example. Alternatively, the length of one of the two rectangular metal bars 2A, 4B can be restricted to L2a or L1a, and the length of the other one of these two rectangular metal bars 2A, 4B can be left as L2b or L1b. Similar considerations hold for rectangular metal bars 4A and 2B.

To generalize from the special case shown in FIG. 5, when an interconnection between a first pair of upper- and lower-layer conductive lines is laid out near an unrelated interconnection between a second pair of upper- and lower-layer conductive lines, to which the first pair of upper- and lower-layer conductive lines should not be connected, if the rectangular metal bars are made so long as to bridge the distance between the first and second pairs of conductive lines in both conductive layers (e.g., lengths L1b and L2b), unintended electrical connections may be created. To avoid this, the rectangular metal bars of one conductive layer or the other should be limited to a length (such as L1a or L2a) that keeps them from reaching the positions of conductive lines in the opposite conductive layer to which they need not be connected.

If lower-layer conductive line 1B in FIG. 5 is not connected to upper-layer conductive line 5B, then rectangular metal bars 2B and 4B are not present, so the lengths of rectangular metal bars 2A and 4A are not subject to the above constraints. Rectangular metal bar 2A can then be set to either length L2a or L2b, and rectangular metal bar 4A to either length L1a or L1b, regardless of the conductive line pitch P in the upper and lower conductive layers and the layout of the semiconductor device.

The longer the rectangular metal bars 2A, 2B, 4A, 4B are in FIG. 5, the greater the photolithographic alignment tolerances become, but the spacing between rectangular metal bar 2A and upper-layer conductive line 5B, between rectangular metal bar 2B and upper-layer conductive line 5A, between rectangular metal bar 4A and lower-layer conductive line 1B, and between rectangular metal bar 4B and lower-layer conductive line 1A is reduced. Consequently, the parasitic capacitance between lower-layer conductive line 1A and upper-layer conductive line 5B, and between lower-layer conductive line 1B and upper-layer conductive line 5A, also increases. Thus, even when the lengths of the rectangular metal bars 2A, 2B, 4A, 4B are set within the limits of L2a and L1a, if large alignment tolerances are not required and parasitic capacitance needs to be reduced, the rectangular metal bars 2A, 2B, 4A, 4B should be made relatively short. Similarly, when there is not so much need to reduce parasitic capacitance and larger alignment tolerances are desired, the rectangular metal bars should be made relatively long.

If lower-layer conductive line 1A is to be connected to upper-layer conductive line 5B in FIG. 5, rectangular metal bars 2A and 4B can be brought into contact by setting their lengths to L2c and L1c. Length L2c is obtained by extending length L2a in the direction of upper-layer conductive line 5B, so that rectangular metal bar 2A passes completely under upper-layer conductive line 5B. Length L1c is obtained by extending length L1a in the direction of lower-layer conductive line 1A so that rectangular metal bar 4B passes completely over lower-layer conductive line 1A. Lengths L1c and L2c are equal, both being 0.8 μm, for example.

Figure 6A:
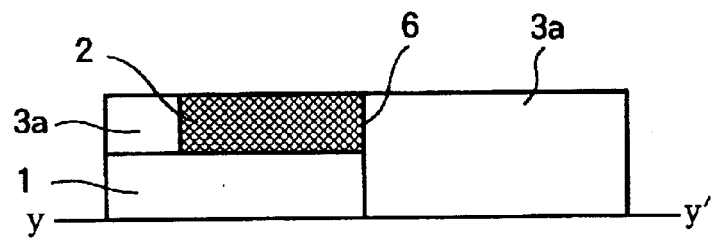
FIGS. 6A, 6B, and 6C illustrate steps in a first fabrication method for the first embodiment.
Figure 6B:
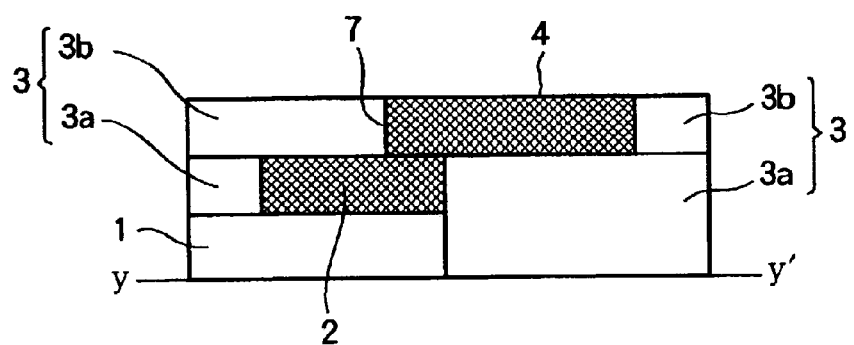
Figure 6C:
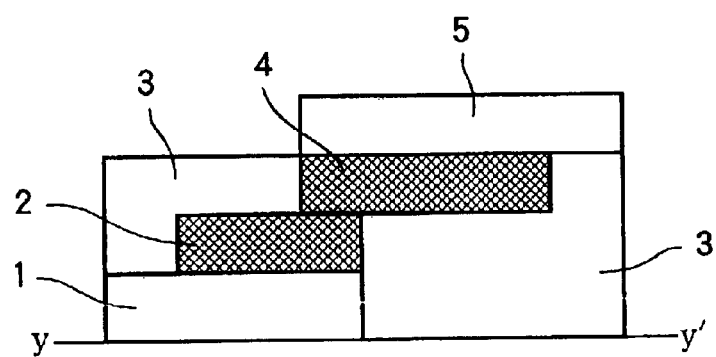

A first method of fabricating a semiconductor device according to the first embodiment is illustrated in FIGS. 6A to 6C, which show the formation of the wiring structure in FIGS. 2A to 2C.

Referring to FIG. 6A, films of a barrier metal (such as titanium) and aluminum are deposited on the surface of a dielectric film that forms a substrate for the lower conductive layer, and the resulting metal layer is patterned by photolithography and etching to form the lower conductive layer, including conductive line 1.

Next, a first inter-layer dielectric film 3a comprising a material such as silicate glass is deposited on the entire surface and planarized by CMP. A rectangular hole 6 is then formed in the first inter-layer dielectric film 3a by photolithography and etching. The photoresist film used to create an etching mask for the rectangular hole 6 has a thickness of substantially eight thousand to nine thousand angstroms (8000–9000 Å). The rectangular hole 6 is formed over and aligned with part of lower-layer conductive line 1, and exposes the surface of this part of lower-layer conductive line 1.

Next, films of a barrier metal (such as titanium) and tungsten are deposited on the entire surface, filling in the rectangular hole 6. The resulting metal layer is planarized by CMP, removing the metal deposited outside the rectangular hole 6 and leaving rectangular metal bar 2.

Referring to FIG. 6B, a second inter-layer dielectric film 3b comprising a material such as silicate glass is deposited on the entire surface, and a rectangular hole 7 is formed in this film 3b by photolithography and etching. The rectangular hole 7 is aligned with the prospective location of part of an upper-layer conductive line 5, and exposes part of the surface of rectangular metal bar 2. The first and second inter-layer dielectric films 3a, 3b constitute the inter-layer dielectric film 3 mentioned above.

Next, films of a barrier metal (such as titanium) and tungsten are deposited on the entire surface, filling in the rectangular hole 7. The resulting metal layer is planarized by CMP, removing the metal outside the rectangular hole 7 and leaving rectangular metal bar 4.

Referring to FIG. 6C, films of a barrier metal (such as titanium) and aluminum are deposited on the entire surface, and the resulting metal layer is patterned by photolithography and etching to form the upper conductive layer, including conductive line 5. This completes the wiring structure according to the first embodiment.

In this first fabrication method, as the surface areas of the rectangular holes 6, 7 exceed those of a conventional through hole, and the rectangular holes 6, 7 are shallower than a conventional through hole, making the aspect ratios of the rectangular holes 6, 7 smaller than the aspect ratio of the through hole, for the same design rules, the rectangular holes 6, 7 can be formed by photolithography and etching with greater stability than can a conventional through hole. Since the rectangular holes 6, 7 are longer than the diameter of the conventional through hole, they also have less stringent photolithographic alignment tolerances. Furthermore, the greater surface areas of the rectangular metal bars 2, 4 produce a lower current density at the interface between them, as compared with a conventional through hole. For these reasons, the process of forming interconnections between different conductive layers becomes more stable, the reliability of the interconnections is improved, and smaller device geometries become feasible.

Figure 7A:
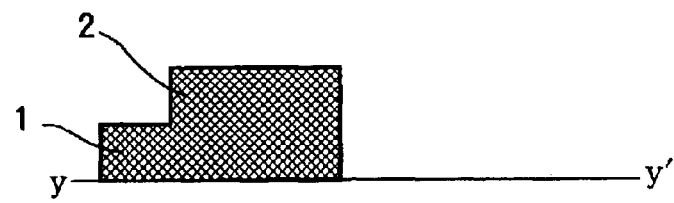
FIGS. 7A, 7B, and 7C illustrate steps in a second fabrication method for the first embodiment.
Figure 7B:
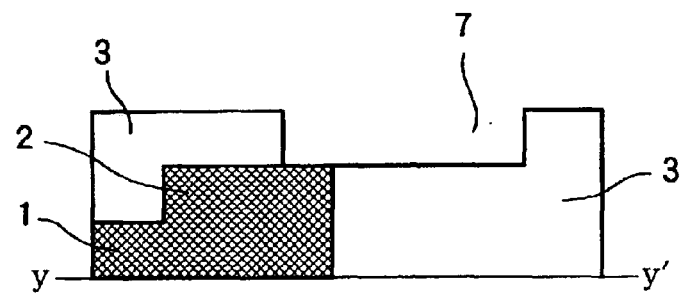
Figure 7C:
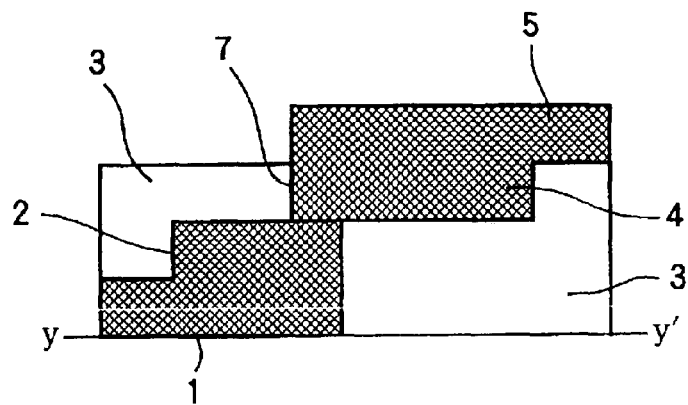

FIGS. 7A, 7B, and 7C illustrate a second method of fabricating a semiconductor device with the wiring structure in FIGS. 2A to 2C.

First, referring to FIG. 7A, films of a barrier metal (such as titanium) and aluminum are deposited on the entire surface of a dielectric film that serves as a wiring substrate, forming a conductive film. The conductive film is patterned to form a conductive pattern, one part of which is a conductive line pattern that will become lower-layer conductive line 1; then a coating of photoresist is applied and patterned by photolithography to form a mask that partly covers the conductive pattern. The exposed parts of the conductive pattern are etched to reduce their height to the desired height of the lower conductive layer, e.g., the height of conductive line 1. The masked parts of the conductive pattern that are left intact above this height form rectangular metal bars such as the rectangular metal bar 2 in FIG. 7A.

Thus according to the second fabrication method, the conductive film formed on the substrate is patterned by photolithography and etching twice to form the lower conductive layer and its attached rectangular metal bars. If the two photolithography and etching processes are carried out as described above, rectangular metal bar 2 is self-aligned with lower-layer conductive line 1. It is also possible, however, to form the lower-layer conductive line 1 and rectangular metal bar 2 in the opposite order from that described above. That is, rectangular metal bar 2 can be patterned by the first photolithography and etching process, and lower-layer conductive line 1 by the second photolithography and process.

Next, referring to FIG. 7B, an inter-layer dielectric film 3 is deposited on the entire surface and planarized by CMP, and a rectangular hole 7 is formed in this film 3 by photolithography and etching. The rectangular hole 7 is aligned with the prospective location of part of an upper-layer conductive line 5, and exposes part of the surface of rectangular metal bar 2.

Next, referring to FIG. 7C, films of a barrier metal (such as titanium) and aluminum are deposited on the entire surface to form a metal layer that fills the rectangular hole 7. The metal layer is then patterned by photolithography and etching to form rectangular metal bar 4 and the upper-layer conductive line 5 simultaneously, completing the wiring structure according to the first embodiment.

Like the first fabrication method, the second fabrication method enables smaller device geometries to be achieved. In addition, rectangular metal bar 2 can be self-aligned with lower-layer conductive line 1, further enhancing the stability of the interconnection formation process, as compared with the formation of conventional through holes with the same design rules.

In the second fabrication method, the lower-layer conductive line 1 is unitary with rectangular metal bar 2, being formed from the same metal layer, and the upper-layer conductive line 5 is unitary with rectangular metal bar 4, both being formed from another metal layer, so connection faults such as high contact resistance and open circuits are less likely to occur than in the first fabrication method.

The second fabrication method is also simpler than the first fabrication method in that the lower-layer conductive line 1 and rectangular metal bar 2 are formed by two photolithography and etching processes applied to the same metal layer, and rectangular metal bar 4 and upper-layer conductive line 5 are formed by a single photolithography and etching process performed on a single metal layer.

The above two fabrication methods can be combined. The lower-layer conductive line 1 and rectangular metal bar 2 can be formed by the first fabrication method, while rectangular metal bar 4 and the upper-layer conductive line 5 are formed by the second fabrication method. Alternatively, the lower-layer conductive line 1 and rectangular metal bar 2 can be formed by the second fabrication method, while rectangular metal bar 4 and the upper-layer conductive line 5 are formed by the first fabrication method.

FIGS. 8A to 8e illustrate a third method of fabricating a semiconductor device with the wiring structure in FIGS. 2A to 2C.

The third fabrication method employs a damascene process. In this process, trenches are formed in a dielectric film, then filled with metal to form conductive lines. The damascene process permits the formation of conductive lines from a low-resistance metal material such as copper.

Figure 8A:
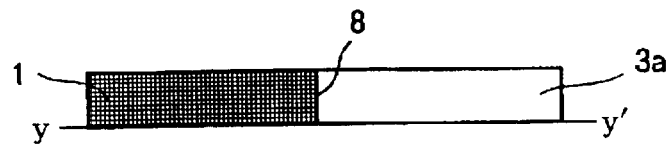
FIGS. 8A, 8B, 8C, 8D, and 8E illustrate steps in a third fabrication method for the first embodiment.

Referring to FIG. 8A, a first inter-layer dielectric film 3a comprising a material such as silicate glass is deposited on the entire surface of a dielectric film which forms a substrate for the lower conductive layer. Then, a trench 8 is formed in each part of the first inter-layer dielectric film 3a in which a conductive line in the lower conductive layer will be formed, by photolithography and etching.

Next, films of a barrier metal (such as titanium) and copper are deposited on the entire surface, forming a metal layer that fills the trenches. The surface is then planarized by CMP, removing the metal layer from regions outside the trenches, leaving a lower-layer conductive line 1 in trench 8.

Figure 8B:
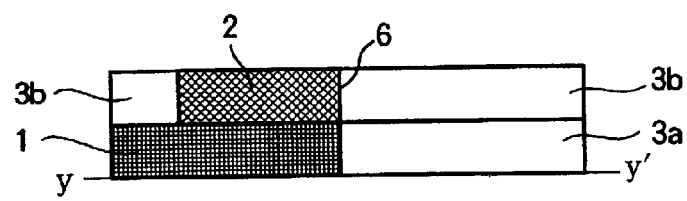

Next, referring to FIG. 8B, a second inter-layer dielectric film 3b comprising a material such as silicate glass is deposited on the entire surface, and a rectangular hole 6 is formed in the second inter-layer dielectric film 3b by photolithography and etching. The rectangular hole 6 is aligned with part of lower-layer conductive line 1, and exposes the surface of that part of lower-layer conductive line 1.

Next, films of a barrier metal (such as titanium) and tungsten are deposited on the entire surface to form a metal layer that fills the rectangular hole 6. The surface is then planarized by CMP, removing this metal layer from regions outside the rectangular hole 6 to form a rectangular metal bar 2.

Figure 8C:
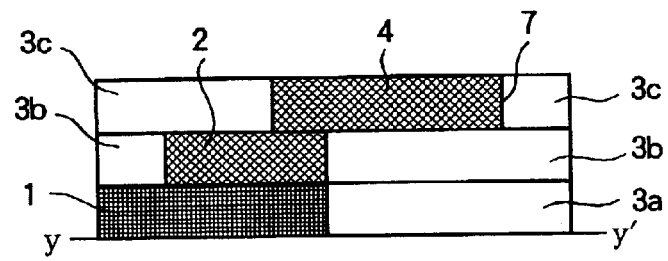

Next, referring to FIG. 8C, an inter-layer dielectric film 3c comprising a material such as silicate glass is deposited on the entire surface, and a rectangular hole 7 is formed in the inter-layer dielectric film 3c by photolithography and etching. The rectangular hole 7 is aligned with the prospective location of part of an upper-layer conductive line 5, and exposes part of the surface of rectangular metal bar 2.

Next, films of a barrier metal (such as titanium) and tungsten are deposited on the entire surface, forming a metal layer that fills the rectangular hole 7. The surface is then planarized by CMP, removing this metal layer from regions outside the rectangular hole 7 to form a rectangular metal bar 4.

Figure 8D:
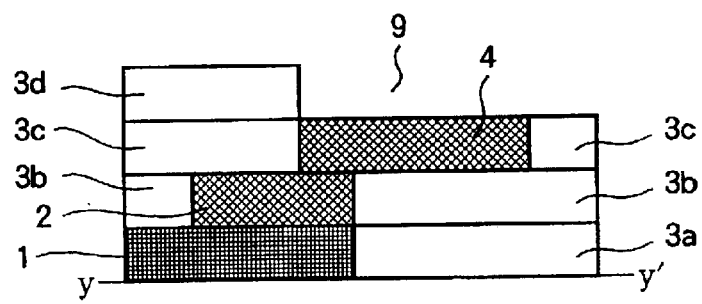

Next, referring to FIG. 8D, an inter-layer dielectric film 3d comprising a material such as silicate glass is deposited on the entire surface, and a trench 9 is formed in each part of the 3d in which a conductive line in the upper conductive layer will be formed, by photolithography and etching. The trench 9 exposes part of the surface of rectangular metal bar 4.

Figure 8E:
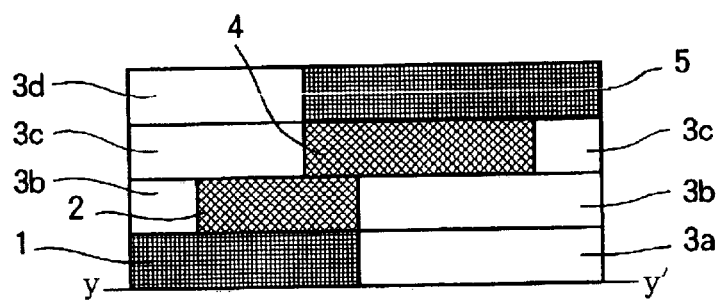

Next, referring to FIG. 8E, films of a barrier metal (such as titanium) and copper are deposited on the entire surface to form a metal layer covering the trench 9. The surface is then planarized by CMP, removing this metal layer from regions outside the trench 9 to form the upper-layer conductive line 5 in the trench 9, thus completing the wiring structure according to the first embodiment.

Like the first fabrication method, the third fabrication method enables smaller device geometries to be achieved. By forming the conductive lines 1, 5 by the damascene process, the third fabrication method also enables low-resistance conductive lines to be formed with a high density.

Figure 9A:
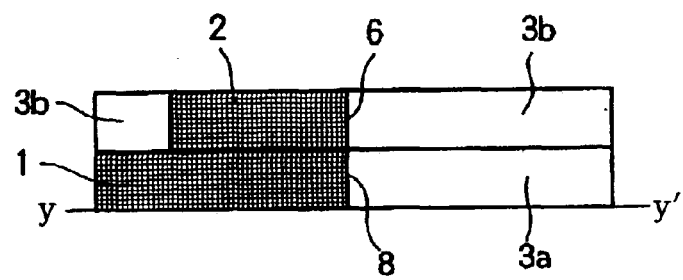
FIGS. 9A, 9B, and 9C illustrate steps in a fourth fabrication method for the first embodiment.
Figure 9B:
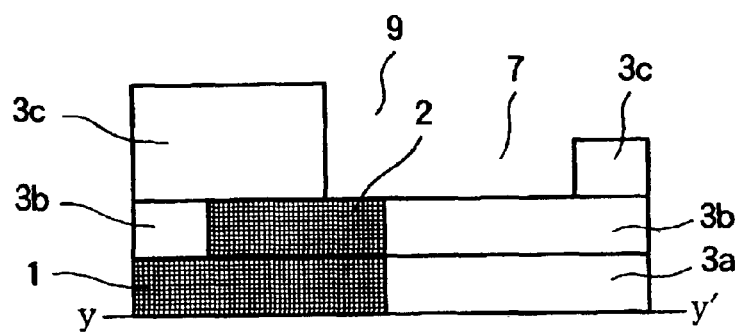
Figure 9C:
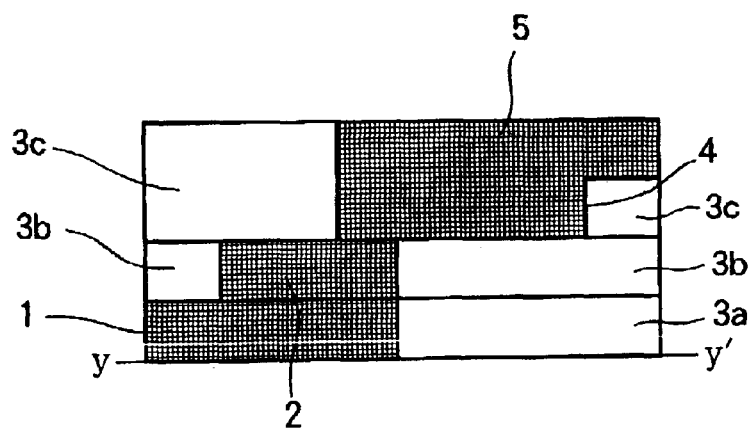

FIGS. 9A to 9C illustrate a fourth method of fabricating a semiconductor device with the wiring structure in FIGS. 2A to 2C.

The fourth fabrication method employs a dual damascene process. In this process, a conductive line and a rectangular metal bar are formed in a single dielectric film. A trench for the conductive line and a rectangular hole for the rectangular metal bar are formed; then both the trench and the rectangular hole are filled with a metal such as copper, forming the conductive line and the rectangular metal bar simultaneously.

First, referring to FIG. 9A, a first inter-layer dielectric film 3a comprising a material such as silicate glass is deposited on the entire surface of a dielectric film which forms the substrate for the lower conductive layer. A trench 8 is formed in each part of the first inter-layer dielectric film 3a in which a conductive line in the lower conductive layer will be formed, by photolithography and etching.

Next, films of a barrier metal (such as titanium) and copper are deposited on the entire surface to form a metal layer filling the trench 8. The surface is then planarized by CMP, removing the metal layer from regions outside the trench 8 to form a lower-layer conductive line 1 in the trench 8.

Next, a second inter-layer dielectric film 3b comprising a material such as silicate glass is deposited on the entire surface, and a rectangular hole 6 is formed in the second inter-layer dielectric film 3b by photolithography and etching. The rectangular hole 6 is aligned with part of the lower-layer conductive line 1, and exposes the surface of that part of the lower-layer conductive line 1.

Next, films of a barrier metal (such as titanium) and copper are deposited on the entire surface to form a metal layer filling the rectangular hole 6. The surface is then planarized by CMP, removing the metal layer from regions outside the rectangular hole 6 to form a rectangular metal bar 2.

Next, referring to FIG. 9B, an inter-layer dielectric film 3c comprising a material such silicate glass is deposited on the entire surface. Then photolithography and etching are performed twice to form a trench 9 and a rectangular hole 7 in the inter-layer dielectric film 3c. A trench 9 is formed in each part of the inter-layer dielectric film 3c in which a conductive line in the upper conductive, layer will be formed. The rectangular hole 7 is aligned below the trench 9, extends for part of the length of the trench 9, and exposes part of the surface of rectangular metal bar 2. The trench 9 and the rectangular hole 7 may be formed in either order: the trench 9 may be formed by the first photolithography and etching process and the rectangular hole 7 by the second photolithography and etching process, or this order may be reversed.

Next, referring to FIG. 9C, films of a barrier metal (such as titanium) and copper are deposited on the entire surface to form a metal layer that fills the rectangular hole 7 and trench 9. The surface is then planarized by CMP, removing the metal layer from regions outside the rectangular hole 7 and trench 9 to form a rectangular metal bar 4 and upper-layer conductive line 5 simultaneously. This completes the formation of a wiring structure according to the first embodiment.

Like the first fabrication method, the fourth fabrication method enables smaller device geometries to be achieved. By forming the lower-layer conductive line 1 and upper-layer conductive line 5 by the damascene process, the fourth fabrication method also enables low-resistance, high-density conductive lines to be formed, as in the third fabrication method. Use of the dual damascene process further enables rectangular metal bar 4 and upper-layer conductive line 5 to be formed from a single metal layer, so that they are unitary with each other, and only one metal deposition process is necessary. The unitary structure reduces the likelihood of connection faults such as high contact resistance or an open circuit between rectangular metal bar 4 and the upper-layer conductive line 5, so the fourth fabrication method is both simpler and more reliable than the third fabrication method.

The inter-layer dielectric films in the first through fourth fabrication methods can be etched by, for example, any of the following methods (1) to (4).

(1) Etching is performed for a fixed time set on the basis of the film thickness and etching rate.

(2) The inter-layer dielectric film has a dual structure comprising an upper film formed of an etchable material such as silicon oxide or silicate glass, and a thin lower film formed of silicon nitride, which acts as an etch-stop layer. Etching is carried out until the upper film has been removed and the lower film is exposed. An etching gas is then used to etch the lower film.

(3) The inter-layer dielectric film, which is formed of an etchable material such as silicon oxide or silicate glass, is deposited on an underlying dielectric film, such as a film of silicon nitride, that is not etched by the same etchant. Etching is stopped when this underlying dielectric film has been reached.

(4) The metal exposed by etching is detected, and a separate end point is set for each etching process on the basis of the detection of the metal.

The metal etching processes in the first and second fabrication methods may performed by, for example, any of the following methods (a) to (c):

(a) Etching is performed for a fixed time set on the basis of the metal film thickness and etching rate.

(b) The metal is etched with an etching gas that does not etch the barrier metal. When the barrier metal is exposed, the etchant is changed to an etching gas that etches the barrier metal.

(c) A separate end point is set for each etching process by detecting the inter-layer dielectric film exposed by the etching process.

As described above, according to the first embodiment, a rectangular metal bar 2 is aligned above the lower-layer conductive line 1, in contact with or unitary with the lower-layer conductive line 1, and a rectangular metal bar 4 is aligned below the upper-layer conductive line 5, in contact with or unitary with the upper-layer conductive line 5. Rectangular metal bar 2 and rectangular metal bar 4 make contact to establish an electrical connection between the lower-layer conductive line 1 and upper-layer conductive line 5. This arrangement can promote the achievement of smaller device geometries, because highly reliable interconnections can be formed in a stable manner, even when the design rules specify very small feature sizes.

Second Embodiment

Figure 10A:
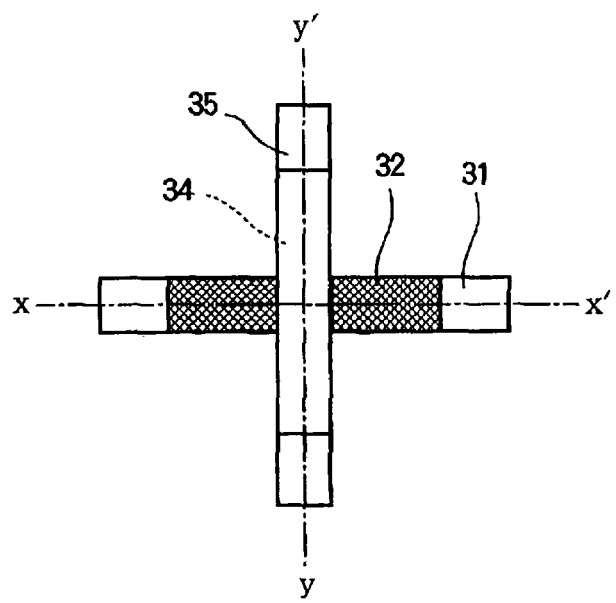
FIG. 10A is a partial plan view of a semiconductor device illustrating a second embodiment of the invention.
Figure 10B:
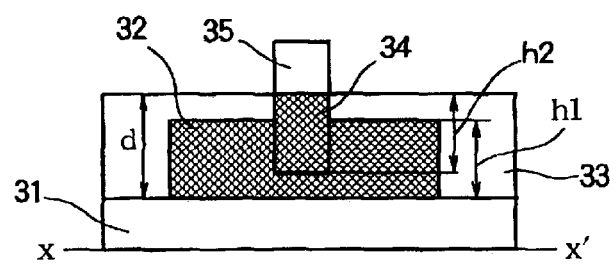
FIG. 10B is a sectional view along line x–x' in FIG. 10A.
Figure 10C:
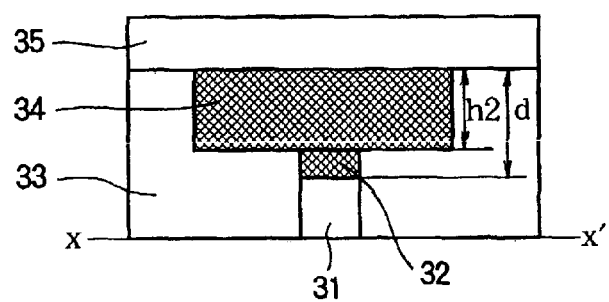
FIG. 10C is a sectional view along line y–y' in FIG. 10A.
Figure 11A:
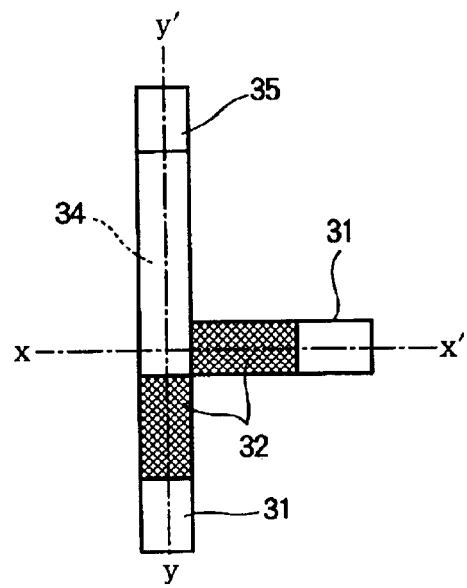
FIG. 11A is another partial plan view of the semiconductor device illustrating the second embodiment.
Figure 11B:
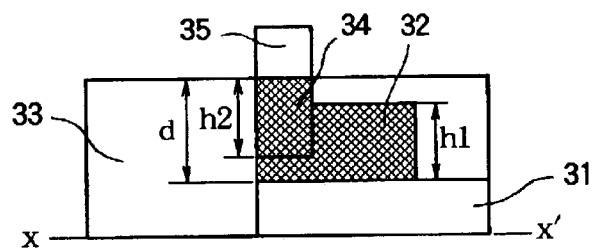
FIG. 11B is a sectional view along line x–x' in FIG. 11A.
Figure 11C:
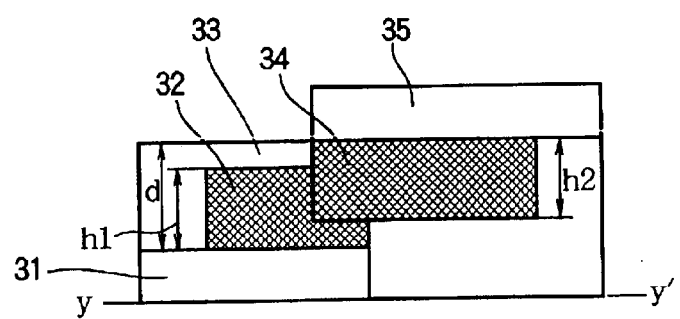
FIG. 11C is a sectional view along line y–y' in FIG. 11A.

FIGS. 10A to 10C and 11A to 11C show the structure of a semiconductor device according to a second embodiment of the present invention. FIGS. 10A and 11A are partial plan views of the device, FIGS. 10B and 11B are sectional views through line x–x' in FIGS. 10A and 11A, respectively, and FIGS. 10C and 11C are sectional views through line y–y' in FIGS. 10A and 11A, respectively. As shown in these drawings, the semiconductor device includes a conductive line 31 in a lower conductive layer, a first conductive member in the form of a rectangular metal bar 32, an inter-layer dielectric film 33, a second conductive member in the form of a rectangular metal bar 34, and a conductive line 35 in an upper conductive layer. The rectangular metal bar 32 has a height h1, the rectangular metal bar 34 has a height h2, and the lower-layer conductive line 1 and upper-layer conductive line 5 are mutually separated by a distance d. In the interconnection structure in FIGS. 10A to 10C, the two conductive lines 31, 35 are straight and cross at substantially a right angle, being interconnected at the crossing point. In the interconnection structure in FIGS. 11A to 11C, the lower-layer conductive line 31 bends at substantially a right angle and the upper-layer conductive line 35 terminates above the bend; the lower-layer conductive line 31 and the upper-layer conductive line 35 are interconnected at the point of the bend. The interconnection structure in FIGS. 11A to 11C can also be modified as in FIGS. 3A to 3C or FIGS. 4A to 4C in the first embodiment.

In the semiconductor device according to the second embodiment, rectangular metal bar 32 is aligned above the lower-layer conductive line 31, and extends for part of the length of the lower-layer conductive line 31, while rectangular metal bar 34 is aligned below the upper-layer conductive line 35, and extends for part of the length of the upper-layer conductive line 35. Rectangular metal bar 32 is formed in contact with or is unitary with the lower-layer conductive line 31, while rectangular metal bar 34 is formed in contact with or is unitary with the upper-layer conductive line 35. The rectangular metal bars 32, 34 make mutual contact, thereby establishing an electrical path between lower-layer conductive line 31 and upper-layer conductive line 35. A slot is formed in the surface of rectangular metal bar 32, and rectangular metal bar 34 makes contact with rectangular metal bar 32 by fitting into this slot.

In the second embodiment, since rectangular metal bar 34 fits into the slot in rectangular metal bar 32, the sum of the height hi of rectangular metal bar 32 and the height h2 of rectangular metal bar 34 is greater than the separation d between the lower-layer conductive line 31 and upper-layer conductive line 35 (d<h1+h2). The separation d is, however, greater than either height h1 or h2 (d>h1 and d>h2). The widths and the lengths of the rectangular metal bars 32, 34 are the same as the widths and lengths of the rectangular metal bars 2, 4 in the first embodiment, described above.

In a semiconductor device according to the second embodiment, as in the first embodiment, the height h1 of rectangular metal bar 32 and the height h2 of rectangular metal bar 34 are both less than the depth of a through hole in a conventional semiconductor device with the same design rules. The aspect ratio of rectangular metal bar 32 (h1/surface area) and the aspect ratio of rectangular metal bar 34 (h2/surface area) are both less than the aspect ratio $d/\pi r^2$ of the conventional through hole (refer to FIG. 14). For this reason, as in the first embodiment, the rectangular holes occupied by the rectangular metal bars 32, 34 can be formed with greater stability than can the corresponding through hole in a conventional semiconductor device. Furthermore, the rectangular metal bars 32, 34 can be formed by photolithography and etching of metal layers, and the alignment tolerances in the photolithographic process can be greater than in a conventional semiconductor device. In addition, the current density at the interface between the rectangular metal bars 32, 34 is less than the conventional current density. Thus, the interconnections in the multilayer wiring structure can be formed with greater stability than in a conventional semiconductor device, and the reliability of the interconnections can be improved.

Since rectangular metal bar 34 sits in the slot formed in the surface of rectangular metal bar 32, not only does the sum of the height h1 of rectangular metal bar 32 and the height h2 of rectangular metal bar 34 exceed the separation d between the lower-layer conductive line 31 and upper-layer conductive line 35, but the area of contact between the rectangular metal bars 32, 34 exceeds the area of contact in the first embodiment. For this reason, the current density at the interface between the rectangular metal bars 32, 34 can be reduced, as compared with the first embodiment, and the interconnection can be made more reliable.

A semiconductor device according to the second embodiment can be fabricated by any of the four fabrication methods described in the first embodiment, with the following modification. When the second rectangular hole is formed by etching, etching is not stopped when the surface of rectangular metal bar 32 is exposed, but is continued to form the slot in rectangular metal bar 32 for receiving rectangular metal bar 34. Specifically, after rectangular metal bar 32 has been formed and the inter-layer dielectric film 33 is formed over the lower-layer conductive line 31 and rectangular metal bar 32, a hole is etched in the inter-layer dielectric film 33 above rectangular metal bar 32, extending to rectangular metal bar 32, using a fluorocarbon gas as an etching gas. This hole exposes the surface of rectangular metal bar 32. Next, the etching gas is changed to a chlorine or fluorine gas to remove part of the exposed rectangular metal bar 32, thereby forming the slot. If rectangular metal bar 32 is made of aluminum, chlorine gas is preferably employed as this etching gas. If rectangular metal bar 32 is made of tungsten, fluorine gas is preferably employed. Since these etching gases may also etch the photoresist forming the etching mask employed for formation of the hole exposing rectangular metal bar 32, the film thickness of this photoresist mask is preferably thicker than in the first embodiment. The upper rectangular hole and the slot in the second embodiment can be formed in a single chamber, without the need for an additional photolithographic process for the slot.

If the third or fourth fabrication method of the first embodiment is employed, the metal material used for forming conductive lines by the damascene process should be a material that can be etched.

According to the second embodiment as described above, rectangular metal bar 32, which is aligned in contact with or unitary with the lower-layer conductive line 31, makes contact with rectangular metal bar 34, which is aligned in contact with or unitary with rectangular metal bar 34, thereby establishing an electrical path between the lower-layer conductive line 31 and the upper-layer conductive line 35. Stable, highly reliable formation of interconnections can be achieved even under fine-dimension design rules, enabling device geometries to be reduced, as in the first embodiment. Furthermore, the sum of the height h1 of rectangular metal bar 32 and the height h2 of rectangular metal bar 34 exceeds the separation d between the lower-layer conductive line 31 and the upper-layer conductive line 35, and the current density at the interface between the first and second conductive members is lower than in the first embodiment, so the reliability of the interconnections can be further improved.

Third Embodiment

Figure 12A:
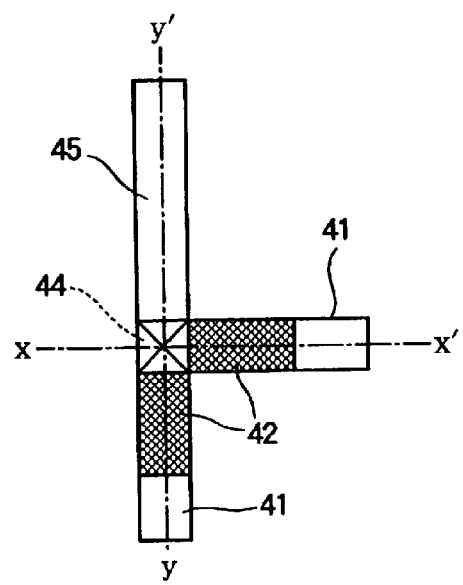
FIG. 12A is a partial plan view of a semiconductor device illustrating a third embodiment of the invention.
Figure 12B:
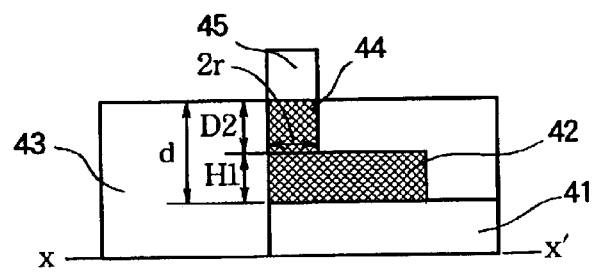
FIG. 12B is a sectional view along line x–x' in FIG. 12A.
Figure 12C:
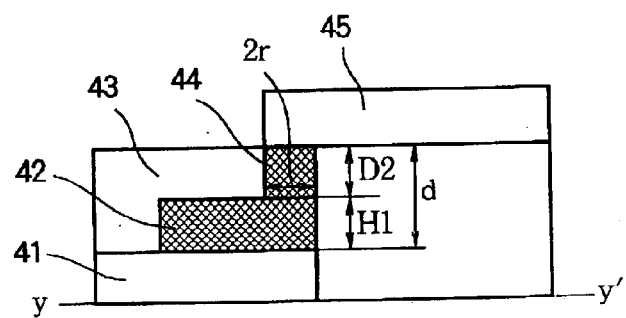
FIG. 12C is a sectional view along line y–y' in FIG. 12A.

FIGS. 12A to 12c show the structure of a semiconductor device according to a third embodiment of the invention. FIG. 12A is a partial plan view, FIG. 12B is a sectional view through line x–x' in FIG. 12A, and FIG. 12C is a sectional view through line y–y' in FIG. 12A. As shown in these drawings, the semiconductor device includes a conductive line 41 in a lower conductive layer, a conductive member in the form of a rectangular metal bar 42, an inter-layer dielectric film 43, a through hole 44, and a conductive line 45 in an upper conductive layer. Rectangular metal bar 42 has a height H1; the through hole 44 has a depth D2 and diameter r2. A separation d is provided between the lower-layer conductive line 41 and the upper-layer conductive line 45. In FIGS. 12A to 12c, the lower-layer conductive line 41 bends at substantially at a right angle and the upper-layer conductive line 45 terminates above the bend in the lower-layer conductive line 41; the end of the upper-layer conductive line 45 is interconnected to the lower-layer conductive line 51 at the point of the bend. The third embodiment is not limited to this structure, however; it is applicable to any of the multilayer wiring structures shown in the first embodiment (FIG. 1A through FIG. 4C).

In a semiconductor device according to the third embodiment, the first conductive member is the rectangular metal bar 42 that is aligned with part of the lower-layer conductive line 41, and is either formed in contact with or is unitary with the lower-layer conductive line 41. The through hole 44 is formed below one part of the upper-layer conductive line 45, and is filled by a metal plug that either makes contact with or is unitary with the upper-layer conductive line 45, forming the second conductive member. Rectangular metal bar 42 makes contact with the metal plug in the through hole 44, thereby establishing an electrical path between the lower-layer conductive line 41 and the upper-layer conductive line 45.

The third embodiment is obtained from the first embodiment by reducing rectangular metal bar 4 to a metal plug disposed in the through hole 44. In the third embodiment, the sum of the height H1 of rectangular metal bar 42 and the depth D2 of the through hole 44 is equal to the separation d between the lower-layer conductive line 41 and the upper-layer conductive line 45 (d=H1+D2). Accordingly, d>H1, and d>D2. The width and length of rectangular metal bar 42 are the same as those of rectangular metal bar 2 in the first embodiment. The diameter 2r of the through hole 44 is the same as the diameter of the through hole 63 in the conventional semiconductor device in FIG. 14.

Since the aspect ratio $D2/\pi r^2$ of the through hole 44 in the third embodiment is less than the aspect ratio $d/\pi r^2$ of a conventional through hole 63 with the same design rules, the process that forms the through hole 44 is more stable than the process that forms the conventional through hole 63. Thus the use of a rectangular metal bar 42 and through hole 44 to interconnect conductive lines in different layers leads to more stable formation of interconnections than in the prior art, and the reliability of the interconnections is improved.

Since no second rectangular metal bar is formed in the third embodiment, even if two unrelated interconnections are laid out close to one another, the length of rectangular metal bar 42 is unconstrained. The length of rectangular metal bar 42 can therefore be set freely, regardless of the separation between adjacent conductive lines in the upper and lower conductive layers, and regardless of the wiring layout of the device. The length of rectangular metal bar 42 can be optimized according to such factors as parasitic capacitance between the upper and lower conductive layers, photolithographic alignment tolerances, and the design rules for the multilayer wiring structure.

A semiconductor device according to the third embodiment can be fabricated by any of the four fabrication methods described in the first embodiment, the through hole 44 being formed by the step that formed the second rectangular hole in the first embodiment, and filled with metal by the step that filled the second rectangular hole with metal in the first embodiment.

As described above, according to the third embodiment, a rectangular metal bar 42 aligned in contact with or unitary with a lower-layer conductive line 41 makes contact with a metal plug in a through hole 44 aligned in contact with or unitary with an upper-layer conductive line 45, electrically interconnecting the lower-layer conductive line 41 and the upper-layer conductive line 45. Highly reliable interconnections can be formed in this way even under fine-dimension design rules, enabling device geometries to be reduced, as in the first embodiment. Furthermore, since no second rectangular metal bar is formed, the length of rectangular metal bar 42 is not constrained by the separation between adjacent conductive lines in the upper and lower conductive layers and the layout of the device.

Fourth Embodiment

Figure 13A:
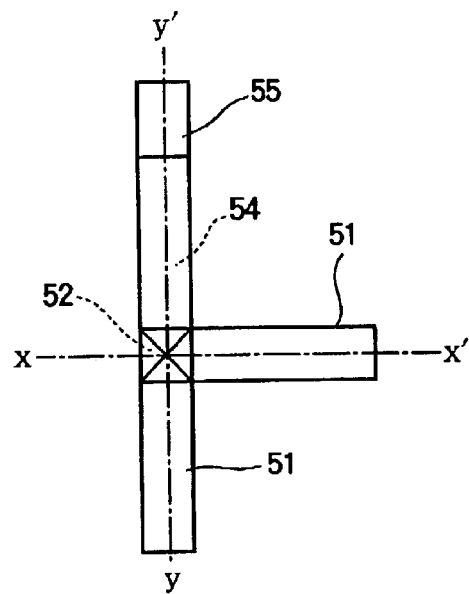
FIG. 13A is a partial plan view of a semiconductor device illustrating a fourth embodiment of the invention.
Figure 13B:
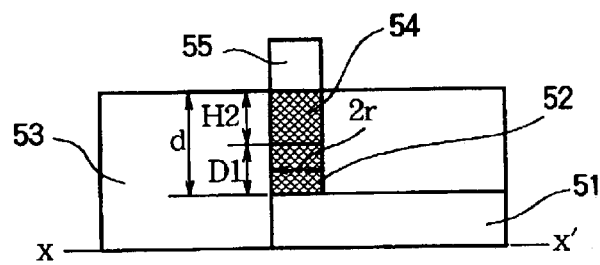
FIG. 13B is a sectional view along line x–x' in FIG. 13A.
Figure 13C:
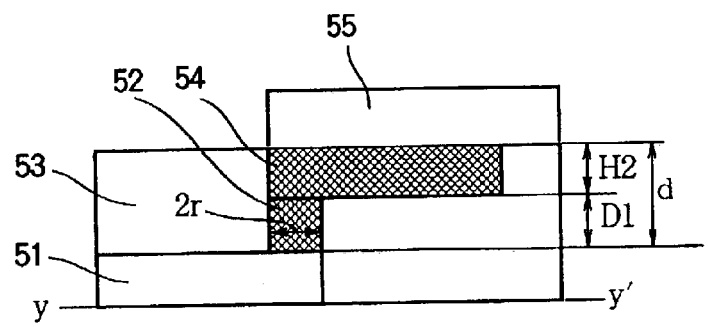
FIG. 13C is a sectional view along line y–y' in FIG. 13A.

FIGS. 13A to 13C show the structure of a semiconductor device according to a fourth embodiment of the invention. FIG. 13A is a partial plan view, FIG. 13B is a sectional view through line x–x' in FIG. 13A, and FIG. 13C is a sectional view through line y–y' in FIG. 13A. As shown in these drawings, the semiconductor device includes a conductive line 51 in a lower conductive layer, a through hole 52, an inter-layer dielectric film 53, a rectangular metal bar 54, and a conductive line 55 in an upper conductive layer. The through hole 52 has a depth D1 and diameter 2r; the rectangular metal bar 54 has a height H2. A separation d is provided between the lower-layer conductive line 51 and the upper-layer conductive line 55. In FIG. 13A to FIG. 13C, the lower-layer conductive line 51 bends at substantially a right angle, and the upper-layer conductive line 55 terminates above the bend in the lower-layer conductive line 51; the end of the upper-layer conductive line 55 is interconnected to the lower-layer conductive line 51 at the point of the bend. The fourth embodiment is not limited to this structure, however; it is applicable to any of the multilayer wiring structures shown in the first embodiment (FIGS. 1A through 4C).

In a semiconductor device according to the fourth embodiment, the through hole 52 is aligned on one part of the lower-layer conductive line 51. A first conductive member is formed by metal filling the through hole 52. The rectangular metal bar 54, which forms the second conductive member, is aligned below the upper-layer conductive line 55, and extends for part of the length of the upper-layer conductive line 55. The rectangular metal bar 54 is formed in contact with or is unitary with the upper-layer conductive line 55. The metal plug in the through hole 52 makes contact with rectangular metal bar 54, thereby establishing an electrical path between the lower-layer conductive line 51 and the upper-layer conductive line 55.

The fourth embodiment is obtained from the first embodiment by reducing rectangular metal bar 2 to a metal plug disposed in the through hole 52. In the fourth embodiment, the sum of the depth D1 of the through hole 52 and the height H2 of rectangular metal bar 54 is equal to the separation d between the lower-layer conductive line 51 and upper-layer conductive line 55 (d=D1+H2). Accordingly, d>D1, and d>H2. The width and length of rectangular metal bar 54 are the same as those of rectangular metal bar 4 in the first embodiment. The diameter 2r of the through hole 52 is the same as the diameter of the through hole 63 in FIG. 14.

Since the aspect ratio $D1\pi r^2$ of the through hole 52 in the fourth embodiment is less than the aspect ratio $d/\pi r^2$ of a conventional through hole 63 with the same design rules, the process that forms the through hole 52 is more stable than the process that forms the conventional through hole 63. Thus the use of a rectangular metal bar 54 and through hole 52 to interconnect conductive lines in different layers leads to more stable formation of interconnections than in the prior art, and the reliability of the interconnections is improved.

In a semiconductor device according to the fourth embodiment, the rectangular metal bar 54 can be made longer than the through-hole diameter 2r. In the photolithographic process for forming the rectangular metal bar 54, the alignment tolerance in the lengthwise direction of the rectangular metal bar 54 with respect to the through hole 52 can be less stringent than in a conventional semiconductor device. This also leads to more stable formation of interconnections, and improves the reliability of the interconnections.

Since no first rectangular metal bar is formed in the fourth embodiment, even if two unrelated interconnections are laid out close to one another, the length of rectangular metal bar 54 is unconstrained. The length of rectangular metal bar 54 can therefore be set freely, regardless of the separation between adjacent conductive lines in the upper and lower conductive layers, and regardless of the wiring layout of the device. The length of rectangular metal bar 54 can be optimized according to such factors as parasitic capacitance between the upper and lower conductive layers, photolithographic alignment tolerances, and the design rules for the multilayer wiring structure.

A semiconductor device according to the fourth embodiment can be fabricated by any of the four fabrication methods described in the first embodiment. In the first, third, and fourth fabrication methods, the through hole 52 is formed by the etching step that formed the first rectangular hole in the first embodiment, and is filled with metal by the step that filled the first rectangular hole with metal in the first embodiment. In the second fabrication method, the metal plug filling the through hole 52 is formed by the step that formed the first rectangular metal bar in the first embodiment.

As described above, according to the fourth embodiment, a metal plug in a through hole 52 aligned in contact with or unitary with a lower-layer conductive line 51 makes contact with a rectangular metal bar 54 aligned in contact with or unitary with an upper-layer conductive line 55, electrically interconnecting the lower-layer conductive line 51 and the upper-layer conductive line 55. Highly reliable interconnections can be formed in this way even under fine-dimension design rules, enabling device geometries to be reduced, as in the first embodiment. Furthermore, since no first rectangular metal bar is formed, the length of rectangular metal bar 54 is not constrained by the separation between adjacent conductive lines in the upper and lower conductive layers and the layout of the device.

Although rectangular metal bars aligned above the lower conductive layer and below the upper conductive layer were used as examples of conductive members in the first thorough fourth embodiments, the conductive members are not limited to rectangular shapes. Other shapes, such as the shape of an ellipse or a rhombus, may be employed. The conductive members in the present invention may have any shape that can be formed on the inter-layer dielectric film within limits defined by conductive lines adjacent to the upper-layer or lower-layer conductive line to which the conductive member is connected, so that the conductive members do connect with the adjacent conductive lines. Thus the width of a conductive member does not need to be the same, or even substantially the same, as the width of the conductive line to which the conductive layer is connected in the upper or lower conductive layer, provided that the conductive member does not become connected to another adjacent conductive line. In many cases, it suffices for the width of the conductive members above the lower conductive layer, for example, to be less than the distance between the adjacent conductive lines in the lower conductive layer, and for the length of the conductive member to be less than the distance between the two conductive lines in the upper conductive layer that are adjacent to the upper-layer conductive line connected to the lower-layer conductive line to which the conductive member is connected.

As described above, the present invention enables the stable formation of highly reliable interconnections between different conductive layers under smaller-dimension design rules than conventionally, thereby contributing to the reduction of semiconductor device geometries.

The fabrication methods described above fall into two general types, which can be summarized as follows.

In one general type of fabrication method, a lower conductive layer including a first conductive line is formed; a first dielectric film is deposited on the first conductive layer; a first hole is formed in the first dielectric film; the first hole is filled with a first conductive material to form a first conductive member making contact with the first conductive line; a second dielectric film is deposited on the first dielectric film and the first conductive member; a second hole is formed in the second dielectric film; and an upper conductive layer and a second conductive member are formed, the upper conductive layer being disposed on the second dielectric film and including a second conductive line, the second conductive member filling the second hole and making contact with the first conductive member and the second conductive line. The first hole and the second hole extend for mutually different distances in at least one direction parallel to the upper conductive layer and the lower conductive layer.

In this method, the lower conductive layer may be formed by depositing a lower dielectric film, forming a trench in the lower dielectric film, and filling the trench with a second conductive material such as copper, thereby forming the first conductive line.

The second hole may be formed by etching the second dielectric film with an etching mask to expose the first conductive member, and etching the first dielectric film and the first conductive member with the same etching mask, thereby forming a slot in the first conductive member.

The upper conductive layer and second conductive member may be formed by depositing a first conductive film on the second dielectric film, thereby filling the second hole, then removing the first conductive film from the second dielectric film, leaving the second hole filled to form the second conductive member; depositing a second conductive film on the second dielectric film and the second conductive member; and patterning the second conductive film to form the upper conductive layer.

Alternatively, the upper conductive layer and the second conductive member may be formed by depositing a first conductive film on the second dielectric film, the first conductive film filling the second hole; removing the first conductive film from the second dielectric film, leaving the second hole filled to form the second conductive member; depositing a third dielectric film on the second dielectric film and the second conductive member; forming a trench in the third dielectric film; and filling the trench with a second conductive material to form the second conductive line.

Another way of forming the upper conductive layer and the second conductive member is to deposit a conductive film on the second dielectric film, thereby filling the second hole, then pattern the conductive film to form the upper conductive layer.

Yet another way to form the upper conductive layer and the second conductive member is to form a trench in the second dielectric film, such that the second hole extends from the trench to the first conductive member, and fill the trench and the second hole with a second conductive material to form the second conductive member and the second conductive line.

In another general type of fabrication method, a lower conductive pattern having a first height is formed, the lower conductive pattern including a first conductive line pattern; part of the first conductive line pattern is masked by depositing a photoresist coating and patterning the photoresist coating by photolithography; the lower conductive pattern is etched to reduce the first height to a second height lower than the first height, thereby forming a lower conductive layer in which all of the first conductive line pattern disposed below the second height constitutes a first conductive line, the masked part of the first conductive line pattern disposed above the second height constituting a first conductive member unitary with the first conductive line; a dielectric film is deposited on the lower conductive layer and the first conductive member; a hole is formed in the dielectric film, the hole extending to the first conductive member; and an upper conductive layer and a second conductive member are formed, the upper conductive layer being disposed on the dielectric film and including a second conductive line, the second conductive member filling the hole in the dielectric film and making contact with the first conductive member and the second conductive line. The first conductive member and the hole in the dielectric film extend for mutually different distances in at least one direction parallel to the upper conductive layer and the lower conductive layer.

In this second general method, the upper conductive layer and the second conductive member may be formed by depositing a conductive film on the dielectric film, the conductive film filling the hole, then patterning the conductive film to form the upper conductive layer.

Alternatively, the upper conductive layer and the second conductive member may be formed by forming a trench in the dielectric film, such that the hole extends from the trench to the first conductive member, and filling the trench and the hole with a second conductive material to form the second conductive member and the second conductive line.

The hole may be formed by etching the dielectric film with an etching mask to expose the first conductive member, and continuing to etch the dielectric film and the first conductive member with the same etching mask, thereby forming a slot in the first conductive member.

A few variations of the preceding embodiments have been mentioned above, but those skilled in the art will recognize that further variations are possible within the scope of the appended claims.

What is claimed is:

1. A method of fabricating a semiconductor device, comprising:

forming a first conductive layer including a first conductive pattern, the first conductive layer extending in a first plane, the first conductive pattern being oriented to conduct an electric signal in a direction parallel to the first plane;

forming a first conductive member disposed at least partly on the first conductive layer, the first conductive member having a first height, the first conductive member making contact with the first conductive pattern and being oriented to conduct said electric signal in a direction orthogonal to the first plane;

forming a second conductive member disposed at least partly on the first conductive member, the second conductive member having a second height, the second conductive member making contact with the first conductive member and being oriented to conduct said electric signal in said direction orthogonal to the first plane;

forming a second conductive layer including a second conductive pattern in a second plane parallel to the first plane the second conductive layer being disposed at least partly on the second conductive member, the second conductive pattern making contact with the second conductive member and being oriented to conduct said electric signal in a direction parallel to the second plane; and forming a dielectric film separating the first conductive layer from the second conductive layer, the dielectric film having a thickness greater than the first height and greater than the second height;

wherein the first conductive member and the second conductive member extend for mutually different distances in at least one direction parallel to the first conductive layer and the second conductive layer.

2. The method of claim 1, wherein the first conductive member and the second conductive member both comprise a metal material.

3. The method of claim 1, wherein the first conductive member is unitary with the first conductive pattern.

4. A The method of claim 1, wherein the first conductive member has a width and a length both equal to a width of the second conductive pattern.

5. The method of claim 1, wherein:

the first conductive pattern extends in a first direction;

the second conductive pattern extends in a second direction different from the first direction;

the first conductive pattern is disposed between a first pair of conductive patterns in the first conductive layer, the first pair of conductive patterns being mutually separated by a first distance in the second direction;

the second conductive pattern is disposed between a second pair of conductive patterns in the second conductive layer, the second pair of conductive patterns being mutually separated by a second distance in the first direction;

the first conductive member extends in the first direction for less than the second distance, and extends in the second direction for less than the first distance; and the second conductive member extends in the first direction for less than the second distance, and extends in the second direction for less than the first distance.

6. The method of claim 1, wherein:

the first conductive member has a width equal to a width of the first conductive pattern and extends parallel to the first conductive pattern for a first length exceeding a width of the second conductive pattern; and the second conductive member has a width equal to the width of the second conductive pattern, and extends parallel to the second conductive pattern for a length exceeding the width of the first conductive pattern.

7. The method of claim 6, wherein the length of the first conductive member exceeds the length of the second conductive member.

8. The method of claim 6, wherein the first conductive member and the second conductive member extend in different lengthwise directions, and the first conductive member has a slot accommodating the second conductive member.

9. A method of fabricating a semiconductor device, comprising:

forming a first conductive layer including a first conductive line;

depositing a first dielectric film on the first conductive layer;

forming a first hole in the first dielectric film;

filling the first hole with a first conductive material to form a first conductive member making contact with the first conductive line;

depositing a second dielectric film on the first dielectric film and the first conductive member;

forming a second hole in the second dielectric film;

forming a second conductive layer and a second conductive member, the second conductive layer being disposed on the second dielectric film, the second conductive layer including a second conductive line, the second conductive member filling the second hole, and the second conductive member making contact with the first conductive member and with the second conductive line;

wherein the first hole and the second hole extend for mutually different distances in at least one direction parallel to the first conductive layer and the second conductive layer.

10. The method of claim 9, wherein forming the first conductive layer comprises:

depositing a third dielectric film;

forming a trench in the third dielectric film; and filling the trench with a second conductive material, thereby forming the first conductive line.

11. The method of claim 10, wherein the second conductive material includes copper.

12. The method of claim 10, wherein forming the second hole comprises:

etching the second dielectric film with an etching mask to expose the first conductive member; and etching the first dielectric film and the first conductive member with said etching mask, thereby forming a slot in the first conductive member.

13. The method of claim 9, wherein forming the second conductive layer and the second conductive member comprises:

depositing a first conductive film on the second dielectric film, the first conductive film filling the second hole;

removing the first conductive film from the second dielectric film, leaving the second hole filled to form the second conductive member;

depositing a second conductive film on the second dielectric film and the second conductive member; and patterning the second conductive film to form the second conductive layer.

14. The method of claim 9, wherein forming the second conductive layer and the second conductive member comprises:

depositing a first conductive film on the second dielectric film, the first conductive film filling the second hole;

removing the first conductive film from the second dielectric film, leaving the second hole filled to form the second conductive member;

depositing a third dielectric film on the second dielectric film and the second conductive member;

forming a trench in the third dielectric film; and filling the trench with a second conductive material to form the second conductive line.

15. The method of claim 9, wherein forming the second conductive layer and the second conductive member comprises:

depositing a conductive film on the second dielectric film, the conductive film filling the second hole; and patterning the conductive film to form the second conductive layer.

16. The method of claim 9, wherein forming the second conductive layer and the second conductive member comprises:

forming a trench in the second dielectric film, the second hole extending from the trench to the first conductive member; and filling the trench and the second hole with a second conductive material to form the second conductive member and the second conductive line.

17. A method of fabricating a semiconductor device, comprising:

forming a first conductive pattern having a first height;

masking part of the first conductive pattern by depositing a photoresist coating and patterning the photoresist coating by photolithography;

etching the first conductive pattern to reduce the height of the first conductive pattern from the first height to a second height that is lower than the first height, thereby forming a first conductive layer in which all of the first conductive pattern disposed below the second height constitutes a first conductive line, the masked part of the first conductive pattern disposed above the second height constituting a first conductive member unitary with the first conductive line;

depositing a dielectric film on the first conductive layer and the first conductive member;

forming a hole in the dielectric film, the hole extending to the first conductive member; and forming a second conductive layer and a second conductive member, the second conductive layer being disposed on the dielectric film and including a second conductive line, the second conductive member filling the hole in the dielectric film and making contact with the first conductive member and the second conductive line; wherein the first conductive member and the hole in the dielectric film extend for mutually different distances in at least one direction parallel to the first conductive layer and the second conductive layer.

18. The method of claim 17, wherein forming the second conductive layer and the second conductive member comprises:

depositing a conductive film on the dielectric film, the conductive film filling the hole; and patterning the conductive film to form the second conductive layer.

19. The method of claim 17, wherein forming the second conductive layer and the second conductive member comprises:

forming a trench in the dielectric film, the hole extending from the trench to the first conductive member; and filling the trench and the hole with a second conductive material to form the second conductive member and the second conductive line.

20. The method of claim 17, wherein forming the hole comprises:

etching the dielectric film with an etching mask to expose the first conductive member; and continuing to etch the dielectric film and the first conductive member with said etching mask, thereby forming a slot in the first conductive member.

* * * * *